United States Patent [19]

Yamashita

[11] Patent Number: 5,077,764
[45] Date of Patent: Dec. 31, 1991

[54] FREQUENCY DIVIDING CIRCUIT CAPABLE OF VARYING DIVIDING RATIO

[75] Inventor: Kazuo Yamashita, Mitaka, Japan

[73] Assignee: Japan Radio Co., Ltd., Tokyo, Japan

[21] Appl. No.: 598,177

[22] Filed: Oct. 15, 1990

[30] Foreign Application Priority Data

Oct. 16, 1989 [JP] Japan .................................. 1-266225

[51] Int. Cl.⁵ ............................................ H03K 21/38
[52] U.S. Cl. ...................................... 377/116; 377/48; 377/108
[58] Field of Search .................... 377/47, 48, 108, 110, 377/116, 114

[56] References Cited

U.S. PATENT DOCUMENTS

| | | | |
|---|---|---|---|
| Re. 32,605 | 2/1988 | Yamashita | 377/108 |
| 3,896,387 | 7/1975 | Kokado | 377/48 |
| 4,394,769 | 7/1983 | Lull | 377/48 |
| 4,573,176 | 2/1986 | Yeager | 377/48 |
| 4,703,495 | 10/1987 | Bereznak | 377/116 |

*Primary Examiner*—John S. Heyman
*Attorney, Agent, or Firm*—Frishauf, Holtz, Goodman & Woodward

[57] ABSTRACT

A frequency dividing circuit divides an input signal of an input frequency into an output signal of an output frequency. The frequency dividing circuit comprises first through fourth latch circuits which operate the input signal, respectively. The first latch circuit delays an original signal into a first delay signal. The second latch circuit delays the first delay signal to produce a second delay signal and a first inverted delay signal which has an antiphase relative to the second delay signal. The third latch circuit delays the second delay signal into a third delay signal as the output signal. The fourth latch circuit receives a first OR signal which is produced by logically adding the third delay signal and mode signal which has first and second levels. The fourth latch signal delays the first OR signal into a fourth delay signal and produces a second inverted delay signal which has an antiphase relative to the fourth delay signal. The first latch circuit receives a second OR signal as the original signal which is produced by logically adding the first and the second inverted delay signals. The output frequency of the output signal has a first frequency when the mode signal has the first level and has a second frequency which is different from the first frequency when the mode signal has the second level.

4 Claims, 4 Drawing Sheets

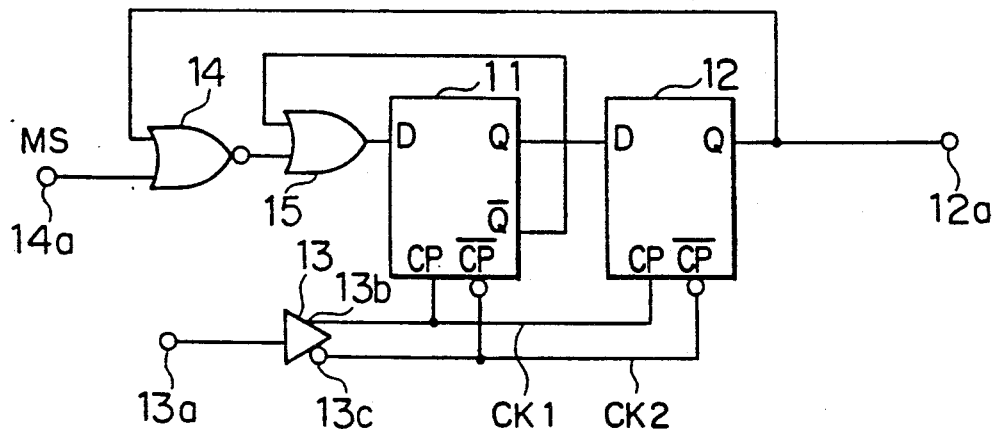
F I G. 1
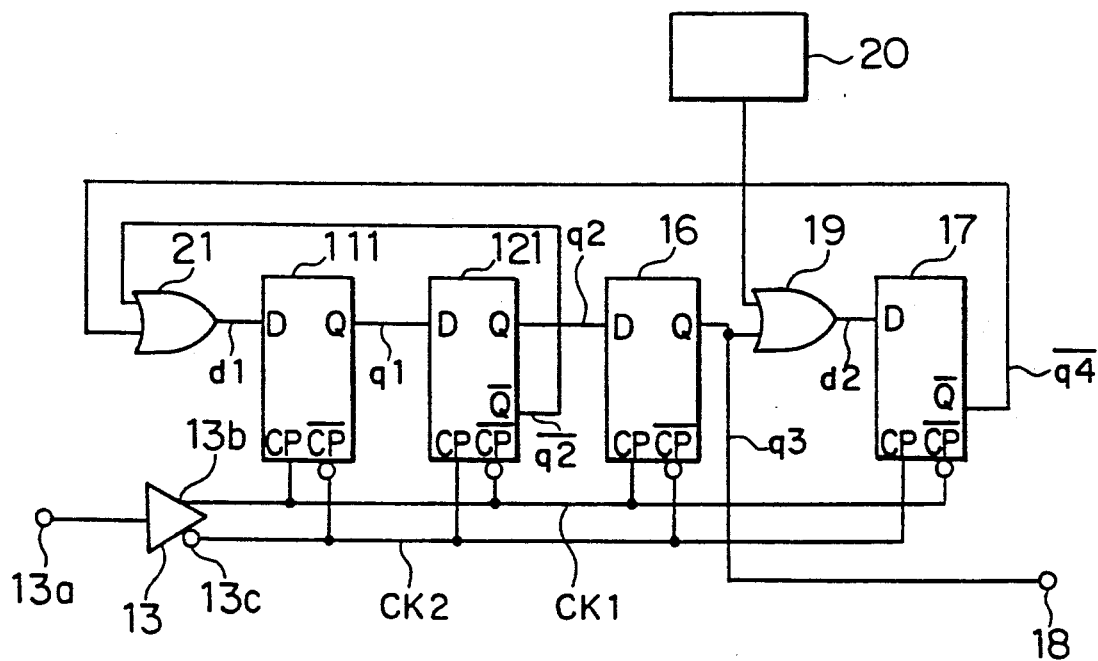
F I G. 2

FREQUENCY DIVIDING CIRCUIT CAPABLE OF VARYING DIVIDING RATIO

BACKGROUND OF THE INVENTION

This invention relates to a frequency dividing circuit for dividing an input signal of an input frequency into an output signal of an output frequency, more particularly, to a frequency dividing circuit which is capable of varying a dividing ratio.

A frequency dividing circuit of the type described comprises a first and a second delay flip flop circuit. The first delay type flip flop circuit is connected to the second delay type flip flop circuit in cascade connection. Responsive to an input signal of an input frequency, the first delay flip flop circuit produces a first delay signal and an inverted delay signal which has an antiphase relative to the first delay signal. Responsive to the first delay signal, the second delay type flip flop circuit produces a second delay signal which is outputted as an output signal of an output frequency.

In a conventional frequency dividing circuit, a mode signal, which is representative of a timing for changing a dividing ratio, is used in order to vary the dividing ratio. The mode signal is supplied together with the second delay signal to a NOR gate. The NOR gate produces a NOR gate signal in response to the mode signal and the second delay signal. The NOR gate signal is supplied together with the inverted delay signal to an OR gate. The OR gate produces an OR gate signal in response to the NOR gate signal and the inverted delay signal to supply the first delay type flip flop circuit with the OR gate signal as an original signal.

As described above, the second delay signal is supplied as the original signal to the first delay type flip flop circuit through the NOR gate and the OR gate. Therefore, it is difficult to operate at a high speed in the conventional frequency dividing circuit because of a delay time in the NOR gate and the OR gate.

SUMMARY OF THE INVENTION

It is an object of this invention to provide a frequency dividing circuit which is capable of operating at a high speed.

Other objects of this invention will become clear as the description proceeds.

According to this invention, there is provided a frequency dividing circuit responsive to an input signal having an input frequency for dividing the input signal of the input frequency into an output signal of an output frequency.

First and second signals are produced in a logic circuit in accordance with the input signal. The first and the second signals have the input frequency, respectively. The second signal has an antiphase relative to the first signal. The frequency dividing circuit comprises a first latch circuit for delaying an original signal in accordance with the first and the second signals to produce a first delay signal, a second latch circuit for delaying the first delay signal in accordance with the second and the first signals to produce a second delay signal and a first inverted delay signal which has an antiphase relative to the second delay signal, a third latch circuit for delaying the second delay signal in accordance with the first and the second signals to produce a third delay signal, a first OR gate responsive to the third delay signal and a mode signal which has first and second levels different from each other to produce a first OR signal, a fourth latch circuit for delaying the first OR signal into a fourth delay signal in accordance with the second and the first signals to produce a second inverted delay signal which has antiphase relative to the fourth delay signal, a second OR gate responsive to the first and the second inverted delay signals for producing a second OR signal as the original signal, and outputting means for outputting the output signal in accordance with the third delay signal. The output frequency of the output signal has a first frequency when the mode signal has the first level and has a second frequency which is different from the first frequency when the mode signal has the second level.

BRIEF DESCRIPTION OF THE DRAWINGS

FIG. 1 is a block diagram of a conventional frequency dividing circuit;

FIG. 2 is a block diagram of a frequency dividing circuit according to a first embodiment of this invention;

DESCRIPTION OF THE PREFERRED EMBODIMENTS

Figure 3:
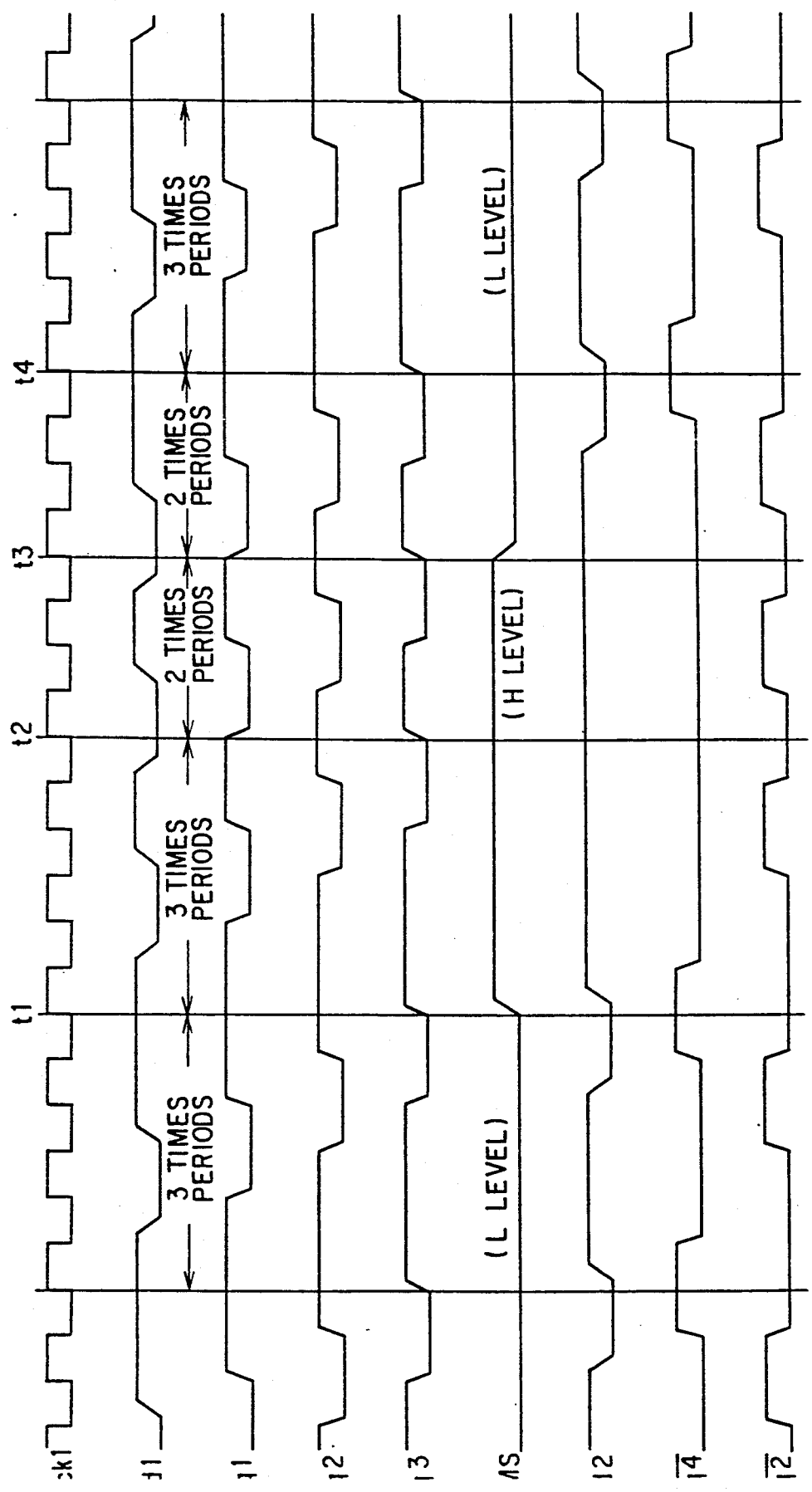
FIG. 3 is a time chart for describing a frequency dividing operation in the frequency dividing circuit of FIG. 2.

Referring to FIG. 1, description will be made as regards a conventional frequency dividing circuit for a better understanding of this invention. The illustrated frequency dividing circuit comprises first and second delay type flip flop (D-F/F) circuits 11 and 12. The first and the second D-F/F circuits 11 and 12 operates by first and second clock signals ck1 and ck2. The first and second clock signals ck1 and ck2 are produced from an input signal CLK by a logic circuit 13. The input signal CLK has an input frequency. The logic circuit 13 has an input terminal 13a and first and second output terminals 13b and 13c. The logic circuit 13 receives the input signal CLK at the input terminal 13a and outputs the first and the second clock signals ck1 and ck2 from the first and the second output terminals 13b and 13c, respectively. The first clock signal ck1 has the input frequency. The second clock signal ck2 has an antiphase relative to the first clock signal ck1.

The first D-F/F circuit 11 latches an original signal by the first clock signal ck1 and holds the original signal by the second clock signal ck2 to produce a first delay signal and an inverted delay signal which has an antiphase relative to the first delay signal. The first delay signal is supplied to the second D-F/F circuit 12.

The second D-F/F circuit 12 latches the first delay signal by the first clock signal ck1 and holds the first delay signal by the second clock signal ck2 to produce a second delay signal which is an output signal outputted from an output terminal 12a and which has an output frequency. The second delay signal is delivered to a NOR gate 14. The NOR gate 14 also receives a mode signal from a mode signal input terminal 14a. The mode signal is representative of a timing for changing dividing ratio. The NOR gate 14 produces a NOR gate signal in response to the second delay signal and the mode signal to supply the NOR gate signal to an OR gate 15. The OR gate 15 also receives the inverted delay signal and produces an OR gate signal in accordance with the NOR gate signal and the inverted delay signal. The OR gate signal is supplied as the original signal to the first D-F/F circuit 11.

In the frequency dividing circuit illustrated in FIG. 1, it is necessary to use the NOR gate 14 and the OR gate 15 in order to produce the original signal. When a circuit delay time is represented in the second D-F/F circuit 12 by $\tau_L$ and a gate delay time is represented in the NOR gate 14 and the OR gate 15 by $\tau_G$, respectively, a driving frequency fH is represented by Equation (1) because a latching time is equal to ½ duration of a period of the first clock signal in the second D-F/F circuit 12.

$$fH = \tfrac{1}{2}(\tau_L + 2\tau_G) \tag{1}$$

It is difficult to operate at a high speed in the conventional frequency dividing circuit as described hereinafter.

Referring to FIG. 2, description will proceed to a frequency dividing circuit according to a first embodiment of this invention. The frequency dividing circuit comprises similar parts which are designated by like reference numerals and are operable with likewise named and denoted signals.

The illustrated frequency dividing circuit comprises first through fourth delay latch (D-LATCH) circuits 111, 121, 16, and 17 which may be called a transparent latch circuit, respectively. The first and the third D-LATCH circuits 111 and 16 carry out a latching operation in accordance with the first clock signal ck1 and carry out a holding operation in accordance with the second clock signal ck2. Otherwise, the second and the fourth D-LATCH circuits 121 and 17 carry out a latching operation in accordance with the second clock signal ck2 and carry out a holding operation in accordance with the first clock signal ck1.

Referring to FIG. 2 together with FIG. 3, the first clock signal ck1 is represented as a first pulse sequence as shown along a first or top row labelled (a) and is supplied to the first through the fourth D-LATCH circuits 111, 121, 16, and 17. The second clock signal ck2 has a second pulse sequence which has an antiphase relative to the first pulse sequence. Accordingly, the second clock signal ck2 is not shown in FIG. 3. When the original signal d1 shown along a second row labelled (b) is supplied to the first D-LATCH circuit 111, the first D-LATCH circuit 111 latches the original signal d1 in accordance with the first clock signal ck1 and holds the original signal d1 in accordance with the second clock signal ck2. As a result, the first D-LATCH circuit 111 produces a first delay signal q1. The first delay signal q1 has a leading edge coincident with a leading edge of one pulse of the first clock signal ck1 when the original signal has a high level. The first delay signal q1 has a trailing edge coincident with the leading edge of another pulse of the first clock signal ck1 when the original signal has a low level as shown along a third row labelled (c).

The first delay signal q1 is supplied to the second D-LATCH circuit 121. The second D-LATCH circuit 121 latches the first delay signal q1 in accordance with the second clock signal ck2 and holds the first delay signal q1 in accordance with the first clock signal ck1. As a result, the second D-LATCH circuit 121 produces a second delay signal q2 and a first inverted delay signal q2 which has an antiphase relative to the second delay signal q2. The second delay signal q2 has a leading edge coincident with a trailing edge of one pulse of the first clock signal ck1 when the first delay signal q1 has a high level. The second delay signal q2 has a trailing edge coincident with the trailing edge of another pulse of the first clock signal ck1 when the first delay signal q1 has a low level as shown along a fourth row labelled (d).

The second delay signal q2 is supplied to the third D-LATCH circuit 16. The third D-LATCH circuit 16 latches the second delay signal q2 in accordance with the first clock signal ck1 and holds the second delay signal q2 in accordance with the second clock signal ck2. As a result, the third D-LATCH circuit 16 produces a third delay signal q3. The third delay signal q3 has a leading edge coincident with a leading edge of one pulse of the first clock signal ck1 when the second delay signal q2 has a high level. The third delay signal q3 has a trailing edge coincident with the leading edge of another pulse of the first clock signal ck1 when the second delay signal q2 has a low level as shown along a fifth row labelled (e).

The third delay signal q3 is outputted as an output signal from an output terminal 18. The third delay signal q3 is also supplied to an OR gate 19. The OR gate 19 is connected to a mode signal supplying circuit 20. The OR gate 19 receives a mode signal MS which is supplied from the mode signal supplying circuit 20. The mode signal MS has a low level and a high level as shown along a sixth row labelled (f). When the mode signal MS has the low level, namely, the mode signal MS is supplied as a low level signal to the OR gate 19, the OR gate 19 outputs a first OR gate signal d2 which is equal to the third delay signal q3 with a little transparent delay as shown along a seventh row labelled (g).

The first OR gate signal d2 is supplied to the fourth D-LATCH circuit 17. The fourth D-LATCH circuit 17 latches the first OR gate signal d2 in accordance with the second clock signal ck2 and holds the first OR gate signal d2 in accordance with the first clock signal ck1. As a result, the fourth D-LATCH circuit 17 produces a second inverted delay signal which is called a fourth delay signal q4. The fourth delay signal q4 has a leading edge coincident with a trailing edge of one pulse of the first clock signal ck1 when the first OR gate signal d2 has a low level. The fourth delay signal q4 has a trailing edge coincident with the trailing edge of another pulse of the first clock signal ck1 when the first OR gate signal d2 has a high level as shown along an eighth row labelled (h).

The fourth delay signal q4 is supplied to a second OR gate 21 together with the first inverted delay signal q2 shown along a ninth row labelled (i). The second OR gate 21 produces a second OR gate signal as the original signal d1 in response to the fourth delay signal q4 and the first inverted delay signal q2.

As readily understood in the above description, the output signal has an output period which is three times of a period of the first clock signal ck1 which is used as the input signal.

By the way, the mode signal MS turns from the low level to the high level at a first time instant t1, the first OR gate signal d2 changes to the high level according to the mode signal MS after the first time instant t1. The fourth delay signal q4 has a trailing edge coincident with a first trailing edge of the first clock signal ck1 which is firstly present after the first time instant t1 since the first OR gate signal d2 has a high level. When the first inverted delay signal q2 turns from a high level to a low level after the first time instant t1, the fourth delay signal q4 has a low level. Therefore, the original signal d1 has a trailing edge coincident with the trailing edge of the first inverted delay signal q2.

In a second time instant t2, the original signal d1 has a low level. Additionally, the first delay signal q1 has a trailing edge coincident with the leading edge of the first clock signal ck1 at the second time instant t2. As readily understood in the above description, the third delay signal q3 has a trailing edge coincident with an initial leading edge of the first clock signal ck1 after the second time instant t2. Since the fourth delay signal q4 has a low level in no concern with the third delay signal q3, the original signal d1 has a trailing edge coincident with the trailing edge of the first inverted delay signal q2. Therefore, the original signal d1 has a period which is two times of a period of the first clock signal ck1.

When the mode signal MS turns from a high level to a low level at a third time instant t3, the first OR gate signal d2 has a trailing edge coincident with an initial leading edge of the first clock signal ck1 after the third time instant t3. Therefore, the fourth delay signal q4 has a leading edge coincident with a second trailing edge of the first clock signal ck1 which is already present after the third time instant t3. At a fourth time instant t4, the fourth delay signal q4 has a high level. As a result, the original signal d1 has a high level at the fourth time instant t4. The original signal d1 has a trailing edge coincident with an initial leading edge of the first clock signal ck1 after the fourth time instant t4. Therefore, the original signal d1 has a period which is three times of a period of the first clock signal ck1 after the fourth time instant t4.

As readily understood in the above description, it is possible to change a dividing ratio or factor to 2 and 3 in the frequency dividing circuit in accordance with the mode signal.

When a circuit delay time is represented in the fourth D-LATCH circuit 17 by $\tau_L$ and a gate delay time is represented in the second OR gate 21 by $\tau_G$, a driving frequency fh in the shown embodiment is represented by Equation (2).

$$fh = \tfrac{1}{2}(\tau_G + \tau_L) \qquad (2)$$

Compared with Equations (1) and (2), it is readily understood that the driving frequency fh is higher than the driving frequency fH.

Although the first through the fourth D-LATCH circuits operate the first and the second clock signals in the first embodiment, the first clock signal may be used to drive the first and the third D-LATCH circuits and the second clock signal may be used to drive the second and the fourth D-LATCH circuits.

Figure 4:
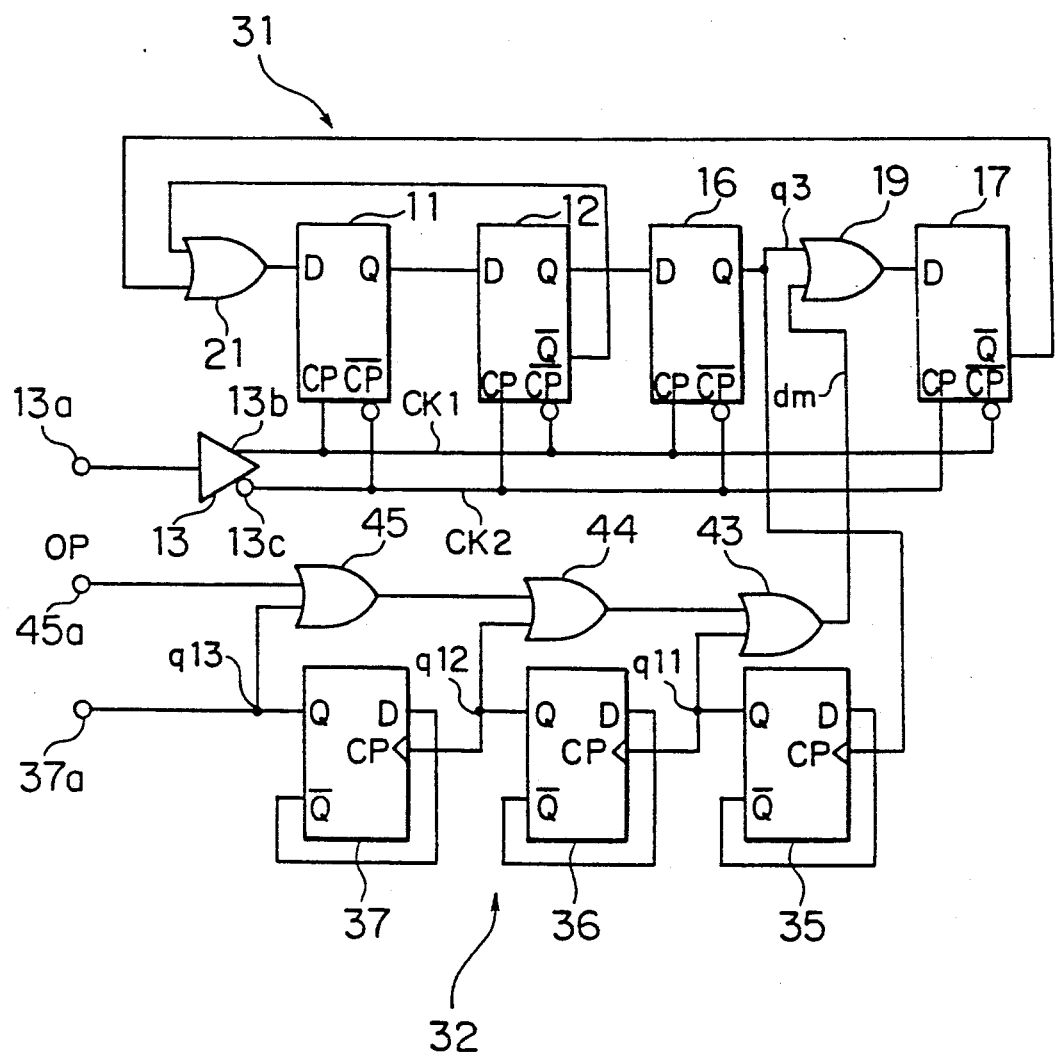
FIG. 4 is a block diagram of a frequency dividing circuit according to a second embodiment of this invention.

Referring now to FIG. 4, description will be directed to a frequency dividing circuit according to a second embodiment of this invention. The illustrated frequency dividing circuit comprises first and second frequency dividing sections 31 and 32. The first frequency dividing section 31 comprises similar parts which are designated by like reference numerals and are operable with likewise named and denoted signals in FIG. 2.

Figure 5A:
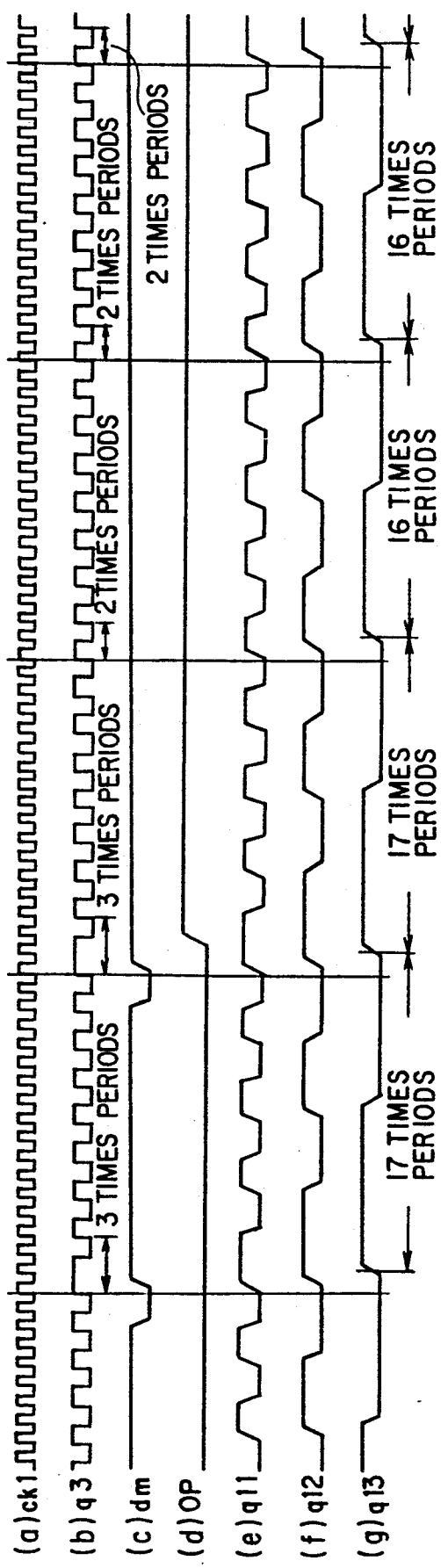
FIG. 5(A) is followed by FIG. 5(B).
Figure 5B:
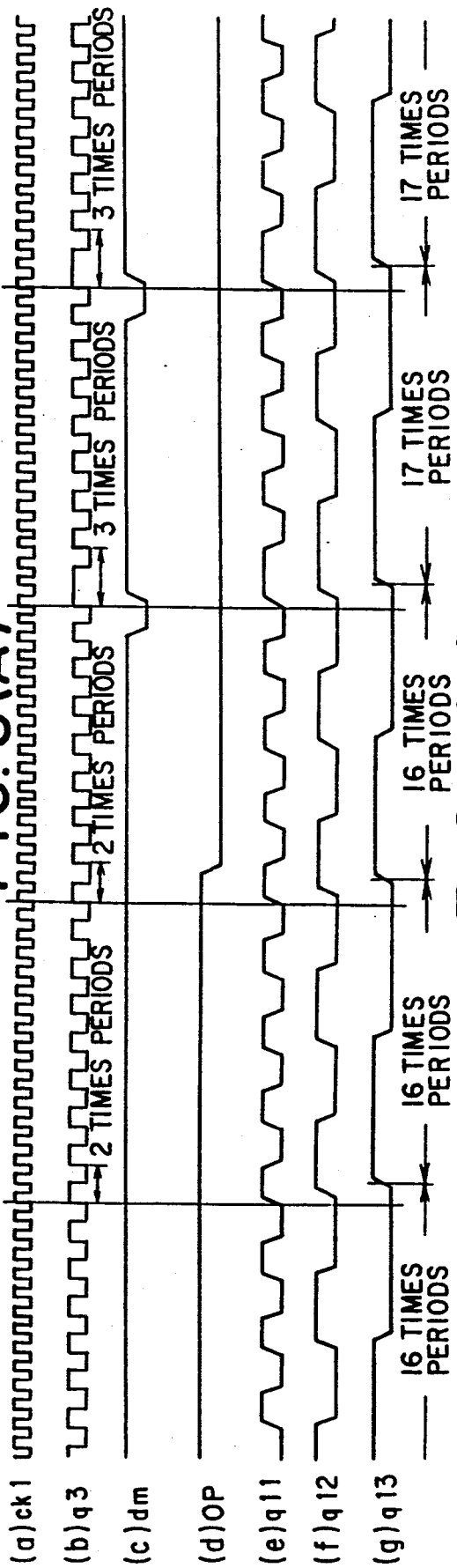
FIG. 5 is a time chart for describing a frequency dividing operation in the frequency dividing circuit of FIG. 4.

Referring to FIG. 5 together with FIG. 4, the second frequency dividing section 32 comprises third through fifth D-F/F circuits 35 to 37. The first frequency dividing section 31 operates in accordance with the first clock signal ck1 which is shown along a first row labelled (a) and produces the third delay signal q3 which is shown along a second row labelled (b) as described above. In the second embodiment, a switching signal dm which is shown along a third row labelled (c) is supplied as the mode signal MS to the first OR gate 19 as described hereinafter. Otherwise the second frequency dividing section 32 receives an operating signal OP in order to produce the switching signal dm. The operating signal OP has a high level and a low level selectively as shown along a fourth row labelled (d).

The third delay signal q3 is supplied as a clock signal to the third D-F/F circuit 35. In the third D-F/F circuit 35, the inverted terminal $\overline{Q}$ is connected to the input terminal D. As a result, the third D-F/F circuit 35 produces a fifth delay signal q11 in accordance with the third delay signal q3 to supply the fifth delay signal q11 to the fourth D-F/F circuit 36 and a third OR gate 43 as shown along a fifth row labelled (e).

In the fourth D-F/F circuit 36, the inverted terminal $\overline{Q}$ is connected to the input terminal D. Therefore, the fourth D-F/F circuit 36 produces a sixth delay signal q12 in accordance with the fifth delay signal q11 to supply the sixth delay signal q12 to the fifth D-F/F circuit 37 and a fourth OR gate 44 as shown along a sixth row labelled (f).

In the fifth D-F/F circuit 37, the inverted terminal $\overline{Q}$ is connected to the input terminal D. Accordingly, the seventh D-F/F circuit 37 produces a seventh delay signal q13 in accordance with the sixth delay signal q12 to output the seventh delay signal as an output signal from an output terminal 37a as shown along a seventh row labelled (g).

The operating signal OP is supplied through an operating signal terminal 45a to the fifth OR gate 45 together with the seventh delay signal q13. When the operating signal OP has a low level, the fifth OR gate 45 produces a fifth OR gate signal which is equal to the seventh delay signal q13. Responsive to the sixth delay signal q12 and the fifth OR gate signal, the fourth OR gate 44 produces a fourth OR gate signal to supply the third OR gate 43 with the fourth OR gate signal. Responsive to the fifth delay signal and the fourth OR gate signal, the third OR gate 43 produces a third OR gate signal as the switching signal dm to supply the first OR gate 18 with the third OR gate signal.

The first frequency dividing section 31 produces the third delay signal q3 as described in the first embodiment. As a result, the seventh delay signal has 17 times period in comparison with the period of the first clock signal ck1.

When the operating signal OP turns a low level to a high level, the seventh delay signal has 16 times period in comparison with the period of the first clock signal ck1 after 17 periods pass in the first clock signal ck1. When the operating signal OP turns a high level to a low level, the seventh delay signal has 17 times period in comparison with the period of the first clock signal ck1 after 16 periods pass in the first clock signal ck1.

In the second embodiment, description is made as regards converting a frequency dividing operation between the 16 frequency division and 17 frequency division. Similarly, it is readily understood to apply this invention to 32/33 frequency division, 64/65 frequency division, and 100/101 frequency division.

What is claimed is:

1. A frequency dividing circuit responsive to an input signal having an input frequency for dividing said input signal of said input frequency into an output signal having an output frequency, said frequency dividing circuit comprising:

a circuit responsive to said input signal for producing first and second signals which have said input frequency, respectively, said second signal having an antiphase relative to said first signal;

a first latch circuit for delaying an original signal in accordance with said first and said second signals to produce a first delay signal;

a second latch circuit for delaying said first delay signal in accordance with said second and said first signals to produce a second delay signal and a first inverted delay signal which has an antiphase relative to said second delay signal;

a third latch circuit for delaying said second delay signal in accordance with said first and said second signals to produce a third delay signal;

a first OR gate responsive to said third delay signal and a mode signal which has first and second levels different from each other to produce a first OR signal;

a fourth latch circuit for delaying said first OR signal into a fourth delay signal in accordance with said second and said first signals to produce a second inverted delay signal which has an antiphase relative to said fourth delay signal;

a second OR gate responsive to said first and said second inverted delay signals for producing a second OR signal as said original signal; and outputting means for outputting said output signal in accordance with said third delay signal, said output frequency of said output signal having a first frequency when said mode signal has said first level and having a second frequency which is different from said first frequency when said mode signal has said second level.

2. A frequency dividing circuit responsive to an input signal having an input frequency for dividing said input signal of said input frequency into an output signal having an output frequency, said frequency dividing circuit comprising:

a circuit responsive to said input signal for producing first and second signals which have said input frequency, respectively, said second signal having an antiphase relative to said first signal;

a first latch circuit for delaying an original signal in accordance with said first signal to produce a first delay signal;

a second latch circuit for delaying said first delay signal in accordance with said second signal to produce a second delay signal and a first inverted delay signal which has an antiphase relative to said second delay signal;

a third latch circuit for delaying said second delay signal in accordance with said first signal to produce a third delay signal;

a first OR gate responsive to said third delay signal and a mode signal which has first and second levels different from each other to produce a first OR signal;

a fourth latch circuit for delaying said first OR signal into a fourth delay signal in accordance with said second signal to produce a second inverted delay signal which has an antiphase relative to said fourth delay signal;

a second OR gate responsive to said first and said second inverted delay signals for producing a second OR signal as said original signal; and outputting means for outputting said output signal in accordance with said third delay signal, said output frequency of said output signal having a first frequency when said mode signal has said first level and having a second frequency which is different from said first frequency when said mode signal has said second level.

3. A frequency dividing circuit as claimed in claim 1, wherein said outputting means comprises:

frequency dividing means for dividing said third delay signal into a predetermined delay signal in a predetermined delay time, producing means for producing said mode signal in accordance with said predetermined delay signal, and an output terminal from which said predetermined delay signal is outputted as said output signal.

4. A frequency dividing circuit as claimed in claim 2, wherein said outputting means comprises:

frequency dividing means for dividing said third delay signal into a predetermined delay signal in a predetermined delay time, producing means for producing said mode signal in accordance with said predetermined delay signal, and an output terminal from which said predetermined delay signal is outputted as said output signal.

* * * * *